United States Patent [19]

Inoue

[11] Patent Number: 4,816,323
[45] Date of Patent: Mar. 28, 1989

[54] MULTILAYER WIRING SUBSTRATE
[75] Inventor: Tatsuo Inoue, Tokyo, Japan
[73] Assignee: NEC Corporation, Tokyo, Japan
[21] Appl. No.: 93,602
[22] Filed: Sep. 8, 1987
[30] Foreign Application Priority Data
   Sep. 8, 1986 [JP]  Japan ................................ 61-209644
[51] Int. Cl.⁴ .................... B32B 3/00; B32B 15/00; C03B 29/00
[52] U.S. Cl. ................................. 428/200; 428/137; 428/209; 428/428; 428/432; 428/901; 156/89; 174/685
[58] Field of Search ............... 428/209, 210, 137, 428, 428/432, 901; 156/89; 174/68.5; 361/397

[56] References Cited
U.S. PATENT DOCUMENTS
   4,652,970  3/1987  Watari et al. .................... 361/385

Primary Examiner—George F. Lesmes
Assistant Examiner—P. J. Ryan
Attorney, Agent, or Firm—Burns, Doane, Swecker & Mathis

[57] ABSTRACT

A multilayer wiring substrate is disclosed. The wiring substrate is provided with a substrate section made of a ceramic material. A plurality of power-supply wiring layers are formed within the substrate section. Additionally, a plurality of first and second through-holes penetrate the substrate section. Formed on a wall surface of the section to define each of the first through-holes are first electrically conductive metal layers, each of which is connected electrically to at least one of the power supply wiring layers. Formed on a wall surface of the section to define each of the second through-holes are coating layers of a fluoride resin dielectric. Second electrically conductive metal layers are formed on the coating layers, respectively. There is also provided a circuit supplied with power via the first electrically conductive metal layers and with signals via the second electrically conductive metal layers.

There is further disclosed a method of manufacturing a multilayer wiring substrate.

3 Claims, 2 Drawing Sheets

MULTILAYER WIRING SUBSTRATE

BACKGROUND OF THE INVENTION

The invention relates to a multilayer wiring substrate for packaging a plurality of electronic elements.

An example of prior art multilayer wiring substrates is disclosed in U.S. Pat. No. 4,652,970. The disclosed substrate includes an alumina ceramic substrate 1, wiring layers 2 made of an organic material, through-holes 12 penetrating the substrate 1, a power supply wiring layer 13 and a ground wiring layer 14. Since the layers 13 and 14, and the through-holes 12, each of which is connected to either the layer 13 or 14, are formed within the substrate 1 of a high relative dielectric constant, the voltage reduction over the layers 13 and 14 and across the through-holes 12 can be kept low. However, because the through-holes 12 are formed within the substrate 1 having the high relative dielectric constant, a signal-propagation delay time through some of the through-holes 12, which are used for signal transmission, increases inevitably.

SUMMARY OF THE INVENTION

An object of the invention is, therefore, to provide a substrate free from the above-mentioned disadvantage in the prior art substrate.

According to one aspect of the invention, there is provided a substrate which comprises: a substrate section made of a ceramic material; a plurality of power supply wiring layers formed within said substrate section; a plurality of first and second through-holes penetrating said substrate section; first electrically conductive metal layers, each of which is formed on a wall surface of said substrate section to define each of said first through-holes and is connected electrically to at least one of said power supply wiring layers; coating layers of a fluoride resin dielectric, each of which is formed on a wall surface of said substrate section to define each of said second through-holes; second electrically conductive metal layers formed on said coating layers, respectively; and a circuit supplied with power via said first electrically conductive metal layers and with signals via said second electrically conductive metal layers.

BRIEF DESCRIPTION OF THE DRAWINGS

Other features and advantages of the invention will become more apparent from the following detailed description when taken in conjunction with the accompanying drawings n which.

In the drawings, the same reference numerals represent the same structural elements.

DETAILED DESCRIPTION OF THE PREFERRED EMBODIMENT

Figure 1:
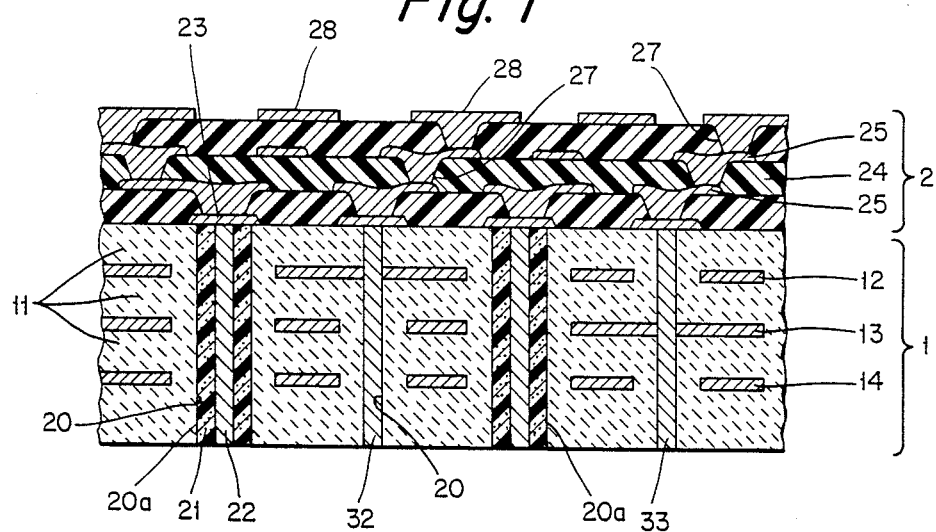
FIG. 1 shows a cross-sectional view of an embodiment of the invention.

Referring now to FIG. 1, an embodiment of the invention comprises a power supply wiring layer section 1 and a signal wiring layer section 2. The section 1 comprises interlayer insulating layers 11 made by adding silicon oxide, calcium oxide, titanium oxide and magnesium oxide to aluminum oxide, which serves as a principal component of the layers 11, to achieve a relative dielectric constant of 10, and power supply wiring layers 12, 13 and 14 made of tungsten and interposed between the layers 11, respectively. Through-holes 20 of a diameter of 0.3 mm (millimeters) are bored at an interval of 1.5 mm in a grid pattern to penetrate through the substrate 1 from its upper surface to its lower surface. Wall surfaces 20a of the section 1 to define the respective through-holes 20 are coated with respective polytetrafluoroethylene films 21. Through-hole wirings 22 made of copper and having a diameter of 0.1 mm are formed within spaces surrounded by the films 21. The layers 12 and 13 are connected to power supply through-hole wirings 32 and 33, respectively. The wirings 32 and 33 are not surrounded with a polytetrafluoroethylene film. Pads 23 made of gold are provided on the upper surface of the section 1, and connected to the wirings 22, 32 and 33. On the section 1 is formed the signal wiring layer section 2 comprising thin-film wiring layers 25 interposed between interlayer insulating layers 24 made of polyimide resin. The layers 25 are formed by gold-plating. Some of the layers 25 are connected to the wirings 22 via the pads 23. Each of via-holes 27 is bored through a corresponding one of the layers 24. Pads 28 made of copper are formed on the upper surface of the section 2 to be electrically connected to circuit elements such as large scale integrated circuits (not shown).

Although the layers 25 are formed by gold-plating in the embodiment, they may be formed by copper-plating.

The method of manufacturing the substrate shown in FIG. 1 will now be described.

Figure 2A:
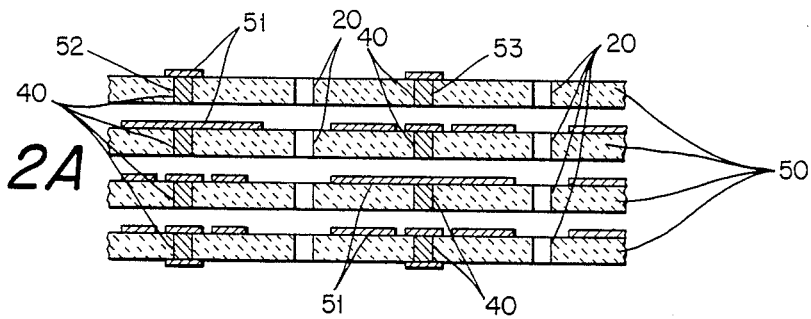
FIGS. 2A through 2E show cross-sectional views for illustrating a method of manufacturing a substrate shown in FIG. 1.

Referring to FIG. 2A, a plurality of separate ceramic green sheets 50 are bored to form through-holes 20 for signals and through-holes 40 for power, and then are printed with a conductive paste containing tungsten, molybdenum or a palladium-silver alloy to form power supply pattern wirings 51 and through-hole wirings 52 and 53.

Figure 2B:
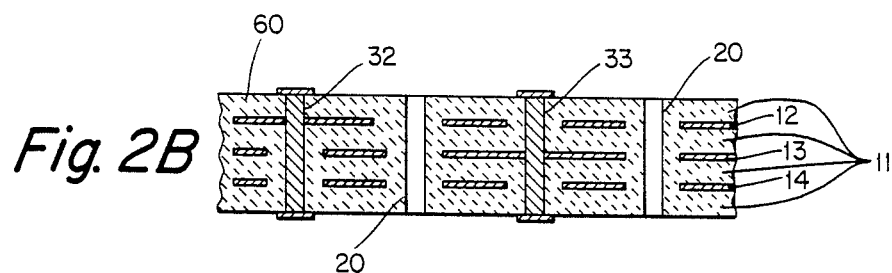

Referring to FIG. 2B, these green sheets 50 are positionally adjusted each other, laminated, pressed, and fired. As a result, a laminated body 60 comprising a plurality of power supply wiring layers 12 to 14 laminated via interlayer insulating layers 11 made of ceramic is formed.

Figure 3:
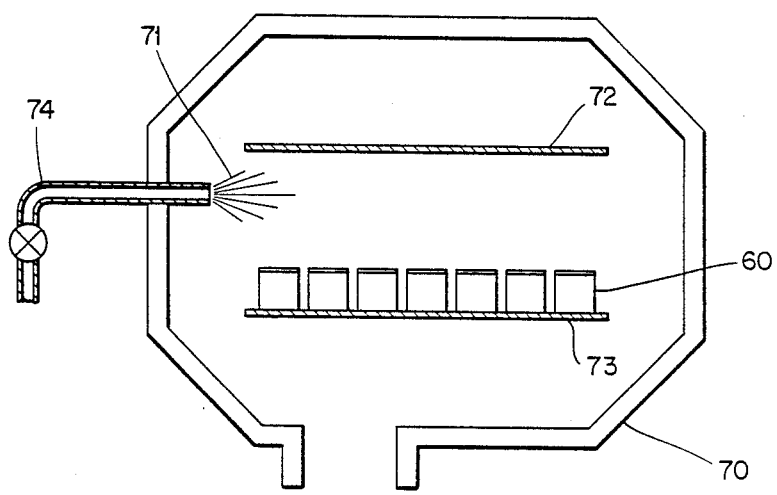
FIG. 3 shows a diagram of a plasma polymerization device.
Figure 2C:
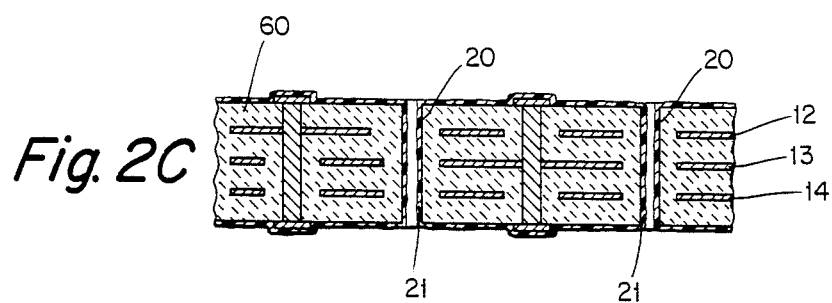

The laminated body 60 is next placed in a plasma polymerization device 7 shown in FIG. 3. The device is depressurized to $5 \times 10^{-3}$ Pa (Pascal), and is then placed in a atmosphere of a argon gas of 1 Pa. Under the argon gas atmosphere, while a tetrafluoroethylene gas 71 is being introduced from an inlet pipe 74 until the pressure inside the device 70 reaches 1 to 50 Pa., electric power of a high frequency of 13.56 megahertz is supplied between electrodes 72 and 73 to generate plasma. This forms polytetrafluoroethylene films on the upper surface of the laminated body 60 and the wall surfaces of the through-holes 20. When the high frequency power is set at 500 watts, the production rate of the polytetrafluoroethylene film becomes 1000 Å (angstrom) per minute. At this rate, it takes three hours to form about 18 $\mu$ (microns) of film. Then, the laminated body 60 is turned upside down to make the lower surface thereof face the electrode 72 so that a polytetrafluoroethylene film is formed under the same conditions as used for the upper surface. In this manner, as shown in FIG. 2C, both the upper and lower surfaces of the laminated body 60 and the wall surfaces of the through-holes 20 are coated with the polytetrafluoroethylene films 21, respectively.

Figure 2D:
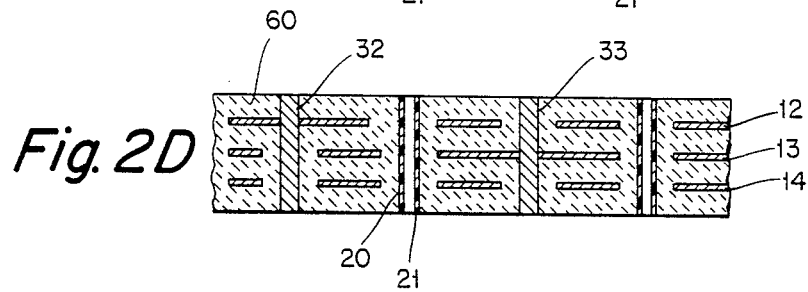

The upper and lower surfaces of the laminated body 60 are subsequently polished to remove the films 21 from the surfaces as shown in FIG. 2D. The films 21 on the wall surfaces of the through-holes 20 remain unremoved.

The laminated body 60 is next placed in a cylindrical plasma etching device. The device is depressurized to a vacuum, fed with a reactive gas consisting of a mixture of 40 percent (%) by volume of oxygen and 60% by volume of nitrogen until the pressure inside the device becomes 50 Pa., and is supplied with a high frequency power of 13.56 megahertzs and 500 watts to perform plasma-etching for 5 minutes. Then, with a direct current magnetron sputtering device, a chromium film of a thickness of 500 Å and a palladium film of a thickness of 1000 Å are sequentially formed on each of the upper and lower surfaces of the body 60 and the films 21 to form a two-film layer. The plasma etching is a pre-treatment of the direct current magnetron sputtering to activate the surfaces of the polytetrafluoroethylene films 21 so as to increase the adhesion to the two-film layers formed on the films, and is effective especially when conducted under a nitrogen gas including an oxygen gas of 40% by volume or more. The similar effect can be achieved by performing ion-milling with an argon gas mixed with an oxygen gas of 5 to 20% by volume, instead of the plasma etching. Since the ion-milling, however, is an anisotropic etching, some contrivances such as the rotating of the laminated body 60 should be made to uniformly process the through-holes as a whole.

The two-film layers, which have been formed by the sputtering device as mentioned above, may be formed by a vacuum deposition device, instead. Further, one film of the two-film layer may be made of titanium or copper instead of chromium, and the other film may be made of platinum, gold, or nickel instead of palladium.

Figure 2E:
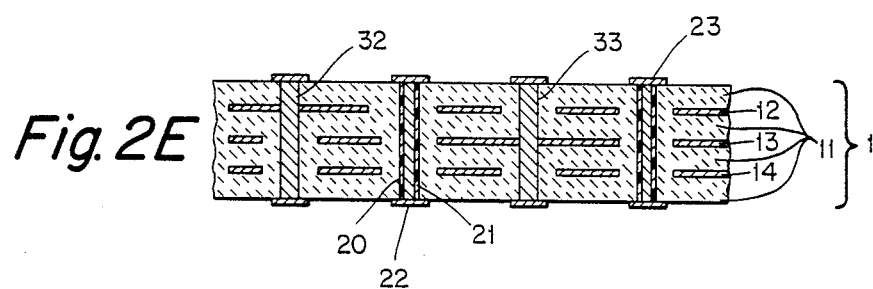

After the formation of the two-film layers, the surfaces of the two-film layers are coated with photosensitive resist of diazo group, only the resist within the through-holes 20 and on both ends of each of the through-hole wirings 32 and 33 is removed by exposure processing and development processing to form a resist pattern. Then, a copper film of a thickness of 1.5 $\mu$ is formed by plating on each of parts of the resist pattern from which the resist has been removed. The resist pattern is next removed by an organic solvent such as butanone, and the two-film layers are etched off by an ion-milling device. In this manner, as shown in FIG. 2E, the section 1 formed with the pads 23 each made of the palladium film, the chromium film and copper film and with the through-hole wirings 22 is completed. Although the copper plating has been used for the through-hole wirings 22 in the embodiment, the copper-plating may be replaced by gold-plating. The tetrafluoroethylene gas used to form the films 21 may be replaced by a chlorofluoroethylene gas to form films of polychlorofluoroethylene as the films 21 by a method similar to the above. The relative dielectric constant of 2.5 can be attained in the polychlorofluoroethylene films.

As mentioned in detail in the foregoing, since the signal through-hole wirings 22 are coated with the fluoride resin films 21 having an extremely low relative dielectric constant, the signal propagation delay time over the through-hole wirings 22 can be minimized.

While this invention has been described in conjunction with the preferred embodiment thereof, it will now readily be possible for those skilled in the art to put this invention into practice in various other manners.

What is claimed is:

1. A multilayer wiring substrate comprising: a substrate section made of a ceramic material; a plurality of power-supply wiring layers formed within said substrate section; a plurality of first and second through-holes penetrating said substrate section; first electriclly conductive metal layers, each of which is formed on a wall surface of said section to define each of said first through-holes and is connected electrically to at least one of said power supply wiring layers; coating layers of a fluoride resin dielectric, each of which is formed on a wall surface of said section to define each of said second through-holes; second electrically conductive metal layers formed on said coating layers, respectively; and a circuit supplied with power via said first electrically conductive metal layers and with signals via said second electrically conductive metal layers.

2. A multilayer wiring substrate as claimed in claim 1, in which said circuit comprises: a plurality of thin film wiring layers formed on said substrate section; insulating layers made of an organic material electrically insulating between said thin film wiring layers; and one or more electronic circuit elements packaged on the uppermost layer of said thin film wiring layers and said insulating layers.

3. A method of manufacturing a multilayer wiring substrate, comprising the steps of: forming a coating layer made of a fluoride resin dielectric on the upper and lower surfaces of a substrate section and on surfaces of said substrate section to define through-holes penetrating through said substrate section made of a ceramic material; removing said coating layer from said upper and lower surfaces of said substrate section; forming a metal layer made of one or more conductive materials on said upper and lower surfaces of said substrate section and on said coating layer; and removing said metal layer except for portions of said metal layer which lie on both ends of each of said through-holes and within said through-holes.

* * * * *